United States Patent
Huang et al.

(10) Patent No.: US 6,825,541 B2
(45) Date of Patent: Nov. 30, 2004

(54) BUMP PAD DESIGN FOR FLIP CHIP BUMPING

(75) Inventors: Tai-Chun Huang, Kaohsiung (TW); Tze-Liang Lee, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/267,769

(22) Filed: Oct. 9, 2002

(65) Prior Publication Data

US 2004/0070079 A1 Apr. 15, 2004

(51) Int. Cl.$^7$ .............................................. H01L 31/00
(52) U.S. Cl. ...................... 257/459; 257/676; 257/786; 438/612
(58) Field of Search ................................ 257/459, 676, 257/786, 748–752, 758–760, 763, 764, 781, 783–784, 915; 438/48, 612, 615–623, 665, 666, 669, 672

(56) References Cited

U.S. PATENT DOCUMENTS

| | | | | |
|---|---|---|---|---|
| 5,404,047 A | * | 4/1995 | Rostoker et al. | 257/786 |
| 5,942,800 A | * | 8/1999 | Yiu et al. | 257/754 |
| 6,100,589 A | * | 8/2000 | Tanaka | 257/758 |
| 6,287,950 B1 | * | 9/2001 | Wu et al. | 438/612 |
| 6,313,540 B1 | * | 11/2001 | Kida et al. | 257/784 |
| 6,500,748 B2 | * | 12/2002 | Anand | 438/612 |
| 6,528,881 B1 | * | 3/2003 | Tsuboi | 257/738 |
| 6,599,578 B2 | * | 7/2003 | Peng et al. | 427/402 |
| 2001/0010408 A1 | * | 8/2001 | Ker et al. | 257/781 |

* cited by examiner

*Primary Examiner*—David Nelms
*Assistant Examiner*—Long Tran
(74) *Attorney, Agent, or Firm*—Tung & Associates

(57) ABSTRACT

Bump pads for flip chips in the packaging of semiconductor integrated circuits. The bump pads are each polygon-shaped and may be provided with multiple bonding apertures, in the form of slots or openings, to improve adhesion of solder bumps to the pads in the assembly of the flip chips. The edges of the flip chip may be provided with multiple interlock fingers and interlock slots which mate with respective interlock slots and fingers in the dielectric layer surrounding the pad in the chip.

717 Claims, 4 Drawing Sheets

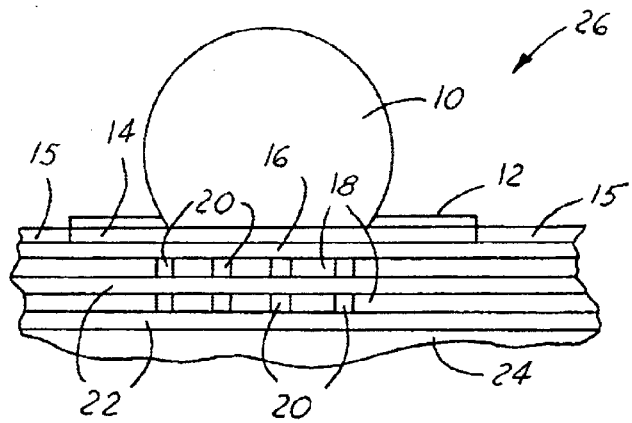
FIG. 1 *Prior Art*
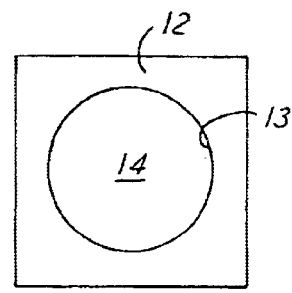
FIG. 1A *Prior Art*
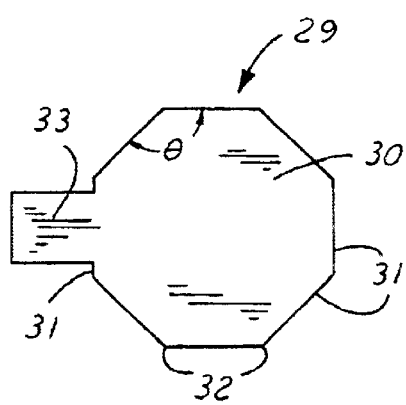
FIG. 2
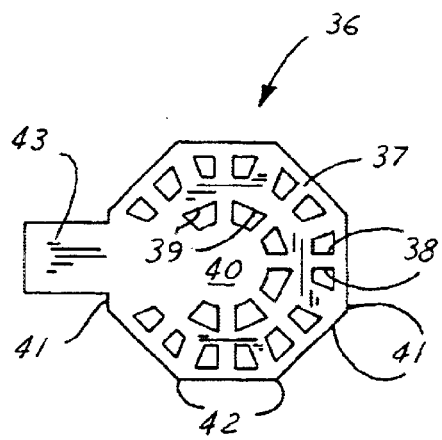
FIG. 3
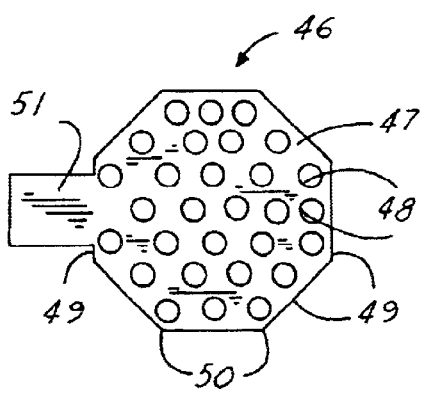
FIG. 4
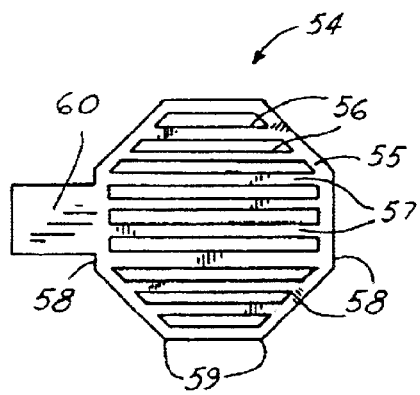
FIG. 5

BUMP PAD DESIGN FOR FLIP CHIP BUMPING

FIELD OF THE INVENTION

The present invention relates to flip chip packaging of semiconductor integrated circuits. More particularly, the present invention relates to new and improved bump pad designs for securing a solder bump to an IC chip in flip chip packaging technology.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the micro-circuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

A section of a typical conventional flip chip 26 is shown schematically in FIG. 1 and includes a solder bump 10 which is soldered directly to the continuous upper surface of a bump pad 14, typically rectangular in configuration, as shown in FIG. 1A, and partially covered by a passivation layer 12. A circular pad opening 13 in the passivation layer 12 exposes the bump pad 14, through which pad opening 13 the solder bump 10 extends. The bump pad 14 is surrounded by a dielectric layer 15 such as an oxide in the chip 26. As further shown in FIG. 1, the bump pad 14 is provided in electrical contact with an upper conductive layer 16, which is separated from an underlying conductive layer 22 by an insulative layer 18. The conductive layers 16, 22 are disposed in electrical contact with each other through conductive vias 20 that extend through the insulative layers 18. The various insulative layers 18 and conductive layers 22 are sequentially deposited on a silicon substrate 24 throughout semiconductor fabrication, in conventional fashion. After the solder bumps 10 are formed on the flip chip 26, the chip 26 is inverted (thus the term, "flip chip") and the solder bumps 10 are bonded to electrical terminals in a substrate (not shown) such as a printed circuit board.

After the solder bumps 10 are bonded to the substrate, the flip chip 26 is subjected to a variety of tests such as, for example, bump shear tests and die shear tests, in which shear stress is applied to the chip to determine the mechanical integrity of the electrical connections between the chip and the bonded substrate. The continuous surface of the bump pad, to which the solder bump adheres, has been found to provide unsatisfactory bonding characteristics of the solder bump to the chip, as revealed by shear tests, since the solder bumps tend to break off from the bump pads upon subjecting the solder bumps to a relatively low threshold value of shear stress. Accordingly, it has been found that providing multiple apertures in the bump pad significantly strengthens the mechanical bond between the solder bump and the bump pad. It has further been found that increasing the number of corners of the bump pad beyond four, in the case of the rectangular bump pad 14 shown in FIG. 1A, enhances the stress distribution characteristics of the bump pads in the dielectric layer of the chip when the solder bumps are subjected to shear stress. This, in turn, strengthens the mechanical interconnection between the flip chip and the substrate to which the chip is bonded. Accordingly, a new and improved design for flip chip bump pads is needed to strengthen the mechanical association between flip chip solder bumps and the bump pads on the chip, as well as to enhance the stress distribution characteristics of the bump pads in the chip.

SUMMARY OF THE INVENTION

An object of the present invention is to provide new and improved solder bump pads which contribute to stronger mechanical association between the solder bump pads and solder bumps on a chip.

Another object of the present invention is to provide bump pads which are used in the assembly of flip chips.

Another embodiment of the present invention is to provide new and improved solder bump pads which enhance the distribution of stress applied to the pads through solder bumps on the pads in order to facilitate stronger mechanical association between the pads and the solder bumps.

Still another embodiment of the present invention is to provide multi-apertured solder bump pads which enhance bonding of solder bumps to the pads.

Another object of the present invention is to provide solder bump pads which may be characterized by a non-continuous bonding surface.

Yet another object of the present invention is to provide solder bump pads which may be shaped in the configuration of a polygon having eight or more corners.

A still further object of the present invention is to provide solder bump pads which may be provided with interlock fingers for interlocking with adjacent layers in a chip.

Yet another object of the present invention is to provide solder bump pads each having corners of less than, equal to or greater than ninety degrees.

In accordance with these and other objects and advantages, the present invention is directed to bump pads particularly for flip chips in the packaging of semiconductor integrated circuits. The bump pads are each polygon-shaped and may be provided with multiple bonding apertures, in the form of slots or openings, to improve adhesion of solder bumps to the pads in the assembly of the flip chips. The edges of the flip chip may be provided with multiple interlock fingers and interlock slots which mate with respective interlock slots and fingers in the dielectric layer surrounding the pad in the chip. The mating interlock fingers and slots tend to improve adhesion of the bump pad with the dielectric layer in the chip. Preferably, but not necessarily, the bump pads have at least eight corners each having an angle of greater than ninety degrees. The multiple corners facilitate a greater stress distribution area on the bump pads against the surrounding dielectric layer, and this tends to stabilize the bump pads in the chip upon application of shear stress to the solder bumps on the bump pads.

In one embodiment of the invention, the bump pad includes a continuous or solid central region which is at least partially surrounded by an inner set of openings. An outer set of openings surrounds the inner set of openings adjacent to the perimeter of the bump pad. In another embodiment, the openings may be circular and are more or less evenly distributed throughout the entire area of the bump pad. In still another embodiment, the bump pad includes multiple slots which extend across the width of the pad and are separated by bands. Any of the apertured embodiments of the bump pad may include the interlock fingers and slots for stabilizing the bond pad in the chip. Further, any of the apertured embodiments of the bump pad may have any number of corners each having an angle of less than, equal to or greater than ninety degrees. Each of the bump pads may have either a one-layered or a two-layered construction.

BRIEF DESCRIPTION OF THE DRAWINGS

The invention will now be described, by way of example, with reference to the accompanying drawings, in which:

FIG. 1 is a schematic view illustrating a typical conventional solder bump and bump pad construction of a semiconductor flip chip;

FIG. 1A is a top schematic view illustrating a typical conventional solder bump and bump pad construction of a semiconductor flip chip;

FIG. 2 is a top view of an illustrative embodiment of a bump pad of the present invention;

FIG. 3 is a top view of a multi-apertured embodiment of a bump pad of the present invention;

FIG. 4 is a top view of an alternative multi-apertured embodiment of the present invention;

FIG. 5 is a top view of a slotted embodiment of the present invention;

DESCRIPTION OF THE PREFERRED EMBODIMENTS

Figure 11:
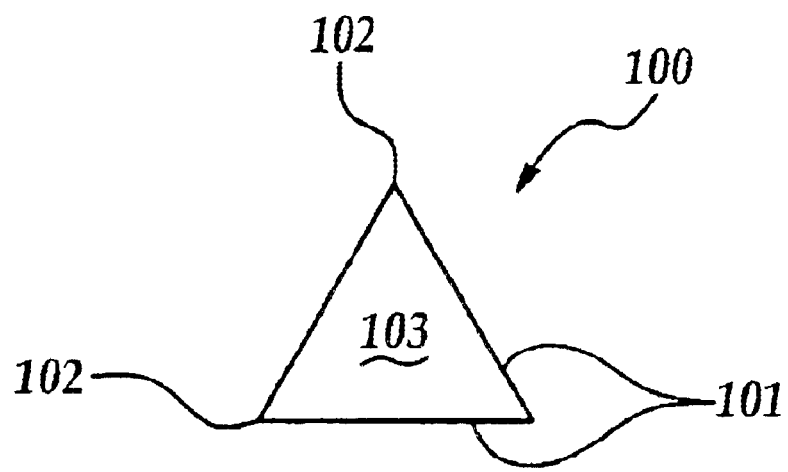
FIG. 11 is a top view of an alternative embodiment of a bump pad of the present invention, illustrating an alternative bump pad configuration which is applicable to each of the bump pad embodiments of FIGS. 1–10.

Referring initially to FIG. 2, in a first embodiment of the present invention a bump pad 29 is typically constructed of a single metal layer of copper or aluminum or has a bilayered metal construction of copper and aluminum, as hereinafter further described. The bump pad 29 has a continuous bonding surface 30 which is bound by pad edges 31 that meet at pad corners 32. While the bump pad 29 shown in FIG. 2 has the shape of an octagon having eight pad edges 31 and eight pad corners 32, it is understood that the bump pad 29 may have the shape of any polygon with any number of pad edges 31 and pad corners 32. Accordingly, the pad corners 32 may have any angle "θ" which is less than, equal to or greater than 90°. For example, a bond pad 100 of alternative configuration, shown in FIG. 11, includes multiple pad edges 101, multiple pad corners 102 each having an angle of less than 90°, and a bonding surface 103. Each of the embodiments hereinafter described may likewise include multiple pad corners 102 having an angle of less than 90°, in the alternative configuration shown in FIG. 11, according to the present invention. A pad extension 33 may extend from one of the pad edges 31. In application, as hereinafter described, the pad edges 31 engage a passivation layer (not shown) or other dielectric layer in a flip chip as the bump pad 29 secures a solder bump (not shown) to the flip chip.

Referring next to FIG. 3, in another embodiment the bump pad 36 has a discontinuous bonding surface 37 which may include a solid central region 40 which is completely or partially surrounded by an inner set of openings 39. An outer set of openings 38 may be provided in the bonding surface 37 outside the inner set of openings 39, adjacent to the pad edges 41. Each of the inner set of openings 39 and the outer set of openings 38 may extend either partially or completely through the thickness of the bump pad 36, as hereinafter further described. While in a preferred embodiment the bump pad 36 is octagon-shaped and has at least eight pad edges 41 and at least eight pad corners 42, it is understood that the bump pad 36 may have the shape of any polygon with any number of pad edges 41 and pad corners 42, and the pad corners 42 may each have any angle which is less than, equal to or greater than 90°. A pad extension 43 may extend from one or more of the pad edges 41.

Referring next to FIG. 4, in another embodiment the bump pad 46 has a discontinuous bonding surface 47 through which extend multiple, typically circular openings 48 which may be more or less evenly distributed on the bonding surface 47. Each of the openings 48 may extend either partially or completely through the thickness of the bump pad 46, as hereinafter further described. While in a preferred embodiment the bump pad 46 is octagon-shaped and has at least eight pad edges 49 and at least eight pad corners 50, it is understood that the bump pad 46 may have the shape of any polygon with any number of pad edges 49 and pad corners 50, and the pad corners 50 may each have any angle which is less than, equal to or greater than 90°. A pad extension 51 may extend from one or more of the pad edges 49.

Referring next to FIG. 5, in another embodiment the bump pad 54 has a discontinuous bonding surface 55 through which extend multiple elongated, adjacent slots 56 that traverse the width of the bonding surface 55 and are separated by adjacent bands 57. Each of the slots 56 may extend either partially or completely through the thickness of the bump pad 54, as hereinafter further described. While in a preferred embodiment the bump pad 54 is octagon-shaped and has at least eight pad edges 58 and at least eight pad corners 59, it is understood that the bump pad 54 may have the shape of any polygon with any number of pad edges 58 and pad corners 59, and the pad corners 59 may have any angle which is less than, equal to or greater than 90°. A pad extension 60 may extend from one or more of the pad edges 58.

Figure 6:
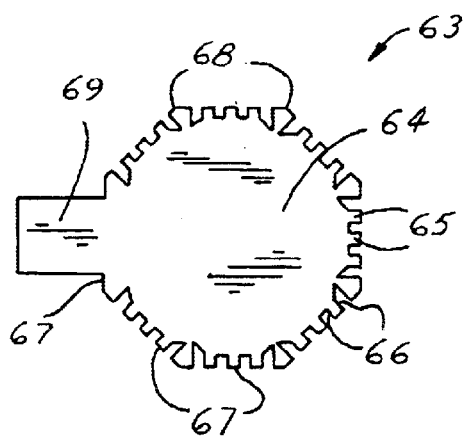
FIG. 6 is a top view of a bump pad of the present invention, provided with interlock fingers and slots.
Figure 7:
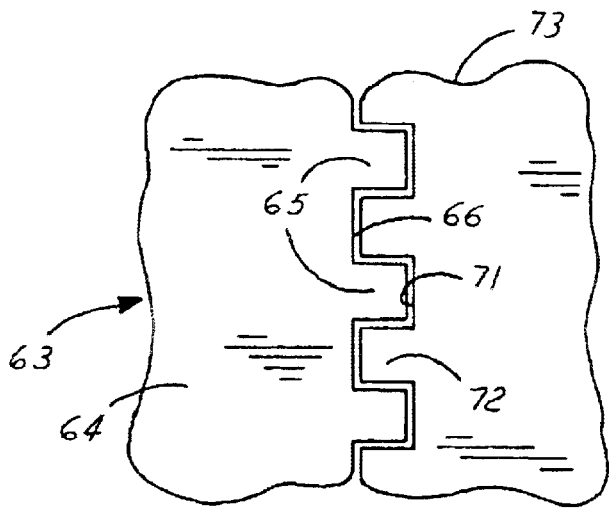
FIG. 7 is a top view illustrating meshing of interlock fingers and slots on the bump pad with companion interlock slots and fingers, respectively, in a surrounding dielectric layer of a chip.

Referring next to FIGS. 6 and 7, in yet another embodiment of the present invention a bump pad 63 has a bonding surface 64 which may be continuous, as illustrated, or discontinuous, as heretofore described with respect to any of FIGS. 3–5. Multiple interlock fingers 65 and intervening interlock slots 66 are provided in each of multiple pad edges 67 of the bump pad 63. In application, as shown in FIG. 7 and hereinafter further described, the interlock fingers 65 and interlock slots 66 are designed to mesh with respective interlock slots 71 and interlock fingers 72, respectively, in an insulative layer 73, such as a passivation layer, in a flip chip. Accordingly, the interlock fingers 65 and interlock slots 66 define a horizontal interlock which provides a greater contact length or surface area between the bump pad 63 and the insulative layer 73 in the chip, and this enhances the stability of the bump pad 63 in the flip chip. While in a preferred embodiment the bump pad 63 is octagon-shaped and has at least eight pad edges 67 and at least eight pad corners 68, it is understood that the bump pad 63 may have the shape of any polygon with any number of pad edges 67 and pad corners 68, and the pad corners 68 may have any angle which is less than, equal to or greater than 90°. A pad extension 69 may extend from one or more of the pad edges 67.

Figure 8:
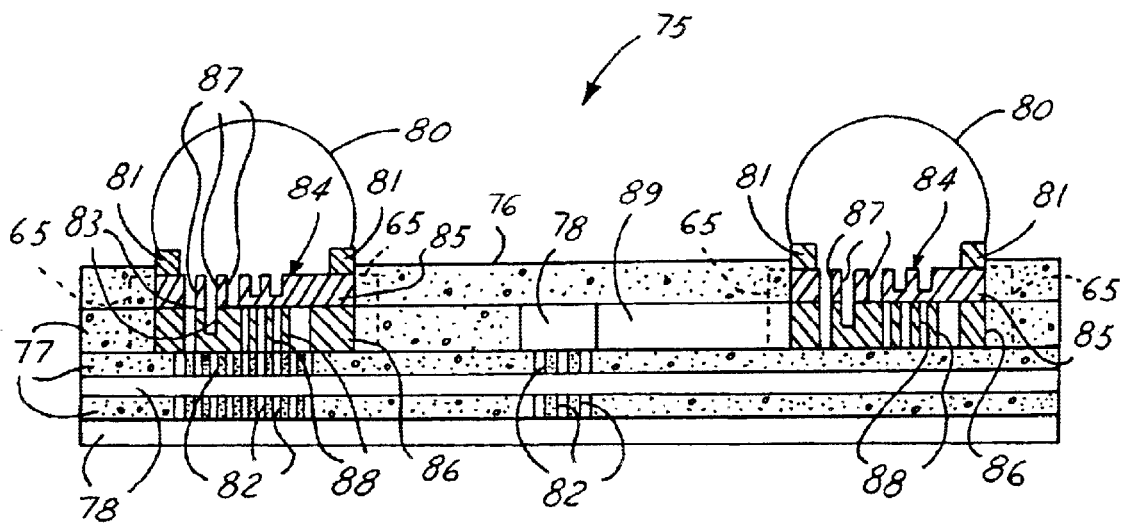
FIG. 8 is a cross-sectional view of a flip chip, illustrating a pair of solder bumps attached to one embodiment of the bump pads of the present invention.

Referring next to FIG. 8, a section of a flip chip 75 includes multiple insulative layers 77 and multiple conductive layers 78 successively deposited on a wafer substrate (not shown). A dielectric passivation layer 76 is typically deposited on the upper insulative layer 77 on the chip 75. A pair of bump pads 84 of the present invention are shown extending through the passivation layer 76 and the upper insulative layer 77 in typical application of the present invention. Each of the bump pads 84 may correspond in design to any of the bump pads heretofore described with respect to FIGS. 2–6. Accordingly, the bump pad 84 may be provided with the interlock fingers 65 (in phantom), which interlock with the interlock fingers 72 (FIG. 7) of the passivation layer 76 and/or insulative layer 77. In the embodiment shown in FIG. 8, each of the bump pads 84 includes a top pad layer 85, which may be aluminum, for example, and a bottom pad layer 86, which may be copper, for example. Multiple apertures 87, which may be the outer openings 38 or inner openings 39 in the embodiment of FIG. 3, the openings 48 of FIG. 4 or the slots 56 of FIG. 5, extend at least partially through the thickness of the bump pad 84. Accordingly, some of the apertures 87 in FIG. 8 extend through both the top pad layer 85 and the bottom pad layer 86, while others of the apertures 87 extend only partially through the bump pad 84. However, each of the apertures 87 may extend either partially or completely through the thickness of the bump pad 84. Multiple via slots 88 may be provided in the bottom layer 86 for contacting vias 82 extending through the insulative layers 77 underlying the bump pad 84. As further shown in FIG. 8, a solder bump 80, which typically includes a suitable mixture of lead and tin, is formed on the bond surface of the bump pad 84 and forms bump extensions 83 which extend downwardly into the respective apertures 87 and define a vertical interlock with the bump pad 84. A UBM (under-bump metal) 81 may be provided beneath the solder bump 80. Accordingly, the bump extensions 83 of the solder bump 80 tend to increase the area of contact between the solder bump 80 and the bump pad 84, and this, in turn, increases the bonding strength of the solder bump 80 with the bump pad 84. As further shown in FIG. 8, each bump pad 84 may be used either in conjunction with an RDL (re-distribution layer) 89, which contacts a conductive layer 78 disposed in electrical contact with underlying conductive layers 78 through vias 82, as shown on the right-hand side of FIG. 8; or without the RDL 89, as shown on the left-hand side of FIG. 8.

Figure 9:
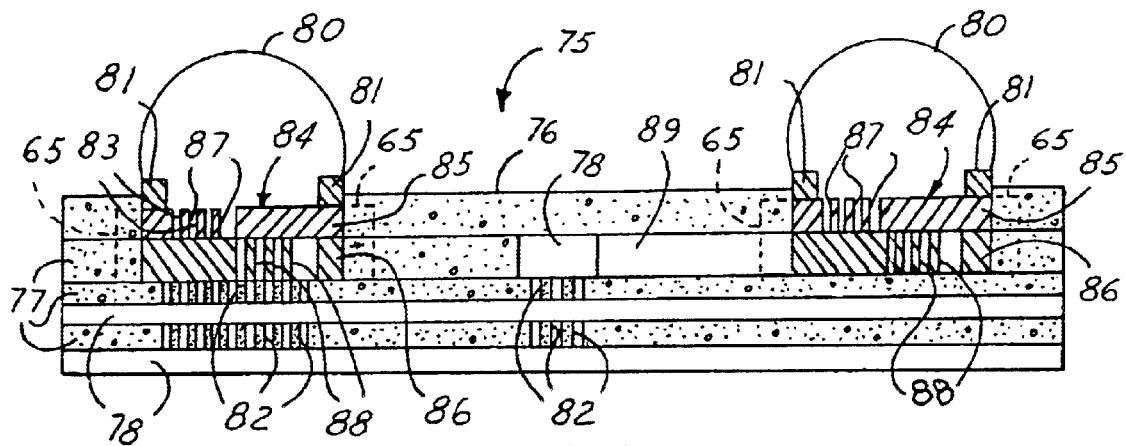
FIG. 9 is a cross-sectional view of a flip chip, illustrating a pair of solder bumps attached to another embodiment of the bump pads of the present invention.

Referring next to FIG. 9, a section of a flip chip 91, having substantially the same construction as the flip chip 75 of FIG. 8 for simplicity, includes another embodiment of the bump pad 92 of the present invention, which bump pad 92 may have the same design and features as any of the bump pads heretofore described with respect to FIGS. 2–6, including the interlock fingers 65, as shown in phantom. In the embodiment shown in FIG. 9, each of the bump pads 92 includes a top pad layer 85, which may be aluminum, for example, and a bottom pad layer 86, which may be copper, for example. Multiple apertures 87, which may be the outer openings 38 and inner openings 39 in the embodiment of FIG. 3, the openings 48 of FIG. 4 or the slots 56 of FIG. 5, extend through the top pad layer 85 of the bump pad 92. Multiple via slots 88 may extend through the bottom pad layer 86 for contacting vias 82 extending through the insulative layers 77 underlying the bump pad 92. As further shown in FIG. 8, the solder bump 80 is formed on the bond surface of the bump pad 92 and forms multiple bump extensions 83 which extend downwardly into the respective apertures 87, which bump extensions 83 define a vertical interlock with the bump pad 92 to increase the area of contact between the solder bump 80 and the bump pad 92, thereby increasing the bonding strength of the solder bump 80 on the bump pad 92.

Figure 10:
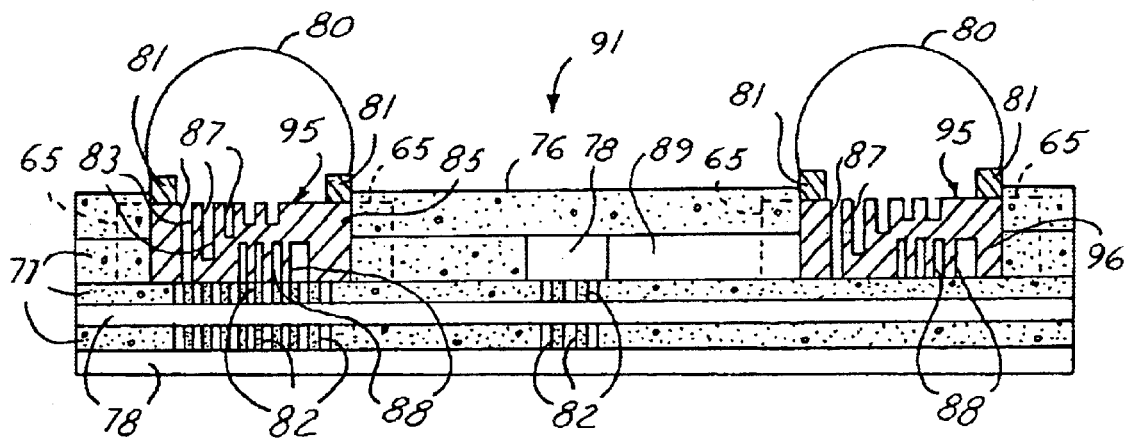
FIG. 10 is a cross-sectional view of a flip chip, illustrating a pair of solder bumps attached to still another embodiment of the bump pads of the present invention.

Referring next to FIG. 10, a section of a flip chip 94, having substantially the same construction as the flip chip 75 of FIG. 8 and the flip chip 91 of FIG. 9 for simplicity, includes still another embodiment of the bump pad 95 of the present invention, which bump pad 95 may have the same design and features as any of the bump pads heretofore described with respect to FIGS. 2–6, including the interlock fingers 65, as shown in phantom. In the embodiment shown in FIG. 10, each of the bump pads 92 includes a single pad layer 96, which may be copper, for example. Multiple apertures 87, which may be the outer openings 38 and inner openings 39 in the embodiment of FIG. 3, the openings 48 of FIG. 4 or the slots 56 of FIG. 5, extend into or through the single pad layer 96 of the bump pad 95. Multiple via slots 88 may be further provided in the single layer 96 for contacting vias 82 extending through the insulative layers 77 underlying the bump pad 95. As heretofore described, the solder bump 80 is formed on the bond surface of the bump pad 95 and forms multiple bump extensions 83 which extend downwardly into the respective apertures 87, which bump extensions 83 define a vertical interlock with the bump pad 95 and increase the area of contact between the solder bump 80 and the bump pad 95, thereby increasing the bonding strength of the solder bump 80 on the bump pad 95.

While the preferred embodiments of the invention have been described above, it will be recognized and understood that various modifications can be made in the invention and the appended claims are intended to cover all such modifications which may fall within the spirit and scope of the invention.

What is claimed is:

1. A bump pad for flip chip assembly, comprising:
    at least one polygon-shaped pad layer having at least one aperture extending at least partially through said at least one pad layer; and
    a plurality of horizontal interlock fingers extending from said at least one pad layer.

2. The bump pad of claim 1 wherein said at least one aperture comprises a plurality of substantially circular openings.

3. The bump pad of claim 2 wherein said at least one pad layer comprises pad corners each having an angle of less than ninety degrees.

4. The bump pad of claim 2 wherein said at least one pad layer comprises pad corners each having an angle of at least ninety degrees.

5. The bump pad of claim 1 wherein said at least one aperture comprises a plurality of inner openings and a plurality of outer openings.

6. The bump pad of claim 5 wherein said at least one pad layer comprises pad corners each having an angle of less than ninety degrees.

7. The bump pad of claim 5 wherein said at least one pad layer comprises pad corners each having an angle of at least ninety degrees.

8. A bump pad for flip chip assembly, comprising:
    at least one polygon-shaped pad layer having at least one aperture extending at least partially through said at least one pad layer;
    wherein said at least one aperture comprises a plurality of apertures; and
    wherein said plurality of apertures comprises a plurality of elongated slots and a plurality of elongated bands separating said plurality of slots.

9. The bump pad of claim 8 wherein said at least one pad layer comprises pad corners catch having an angle of less than ninety degrees.

10. The bump pad of claim 8 wherein said at least one pad layer comprises pad corners each having an angle of at least ninety degrees.

11. The bump pad of claim 8 further comprising a plurality of horizontal interlock fingers provided in said at least one pad layer.

12. A bump pad for flip chip assembly, comprising:
    at least one polygon-shaped pad layer having at least five pad corners; and
    a plurality of horizontal interlock fingers provided in said at least one pad layer.

13. The bump pad of claim 12 wherein said at least five pad corners each has an angle of less than ninety degrees.

14. The bump pad of claim 12 wherein said at least five pad corners each has an angle of at least ninety degrees.

15. A bump pad for flip chip assembly, comprising:
    a polygon-shaped top pad layer and a polygon-shaped bottom pad layer beneath said top pad layer;
    a plurality of apertures extending into at least said top pad layer; and
    a plurality of horizontal interlock fingers provided in at least one of said top pad layer and said bottom pad layer.

16. The bump pad of claim 15 further comprising a plurality or via slots provided in said bottom pad layer.

17. The bump pad of claim 16 further comprising a pad extension extending from at least one of said top pad layer and said bottom pad layer.

* * * * *